United States Patent [19]

Baca et al.

[11] Patent Number: 5,479,033
[45] Date of Patent: Dec. 26, 1995

[54] COMPLEMENTARY JUNCTION HETEROSTRUCTURE FIELD-EFFECT TRANSISTOR

[75] Inventors: Albert G. Baca; Timothy J. Drummond; Perry J. Robertson; Thomas E. Zipperian, all of Albuquerque, N.M.

[73] Assignee: Sandia Corporation, Albuquerque, N.M.

[21] Appl. No.: 250,088

[22] Filed: May 27, 1994

[51] Int. Cl.$^6$ ............... H01L 31/0378; H01L 31/072
[52] U.S. Cl. ............................... 257/192; 257/194
[58] Field of Search ........................ 257/192, 194, 257/256, 265, 272, 15, 18, 24, 369, 195

[56] References Cited

U.S. PATENT DOCUMENTS

| | | | |
|---|---|---|---|
| 4,117,587 | 10/1978 | Kano | 29/571 |
| 4,811,075 | 3/1989 | Eklund | 357/46 |
| 5,010,025 | 4/1991 | Solomon | 437/29 |
| 5,031,007 | 7/1991 | Chaffin | 357/22 |
| 5,060,030 | 10/1991 | Hoke | 257/18 |
| 5,060,031 | 10/1991 | Abrokwah | 357/22 |
| 5,122,851 | 6/1992 | Solomon | 357/30 |
| 5,130,770 | 7/1992 | Blanc | 357/23.7 |
| 5,142,349 | 8/1992 | Zhu | 357/42 |
| 5,198,879 | 3/1993 | Ohshima | 257/24 |
| 5,243,206 | 9/1993 | Zhu | 257/192 |

OTHER PUBLICATIONS

Baca et al; "A GaAs Complementary Junction–gated HFET Technology"; Dec. 1–3, 1993; International Semiconductor Device Research Syposium.

Zuleeq et al; "Double Implanted GaAs Complementary JFET's" IEEE Electron Device Letters, vol. EDL–5, No. 1; Jan. 1, 1984 pp. 21–23.

A. G. Baca et al., "Complimentary GaAs Junction–Gated Heterostructure Field Effect Transistor Technology," to be presented at the IEEE GaAs IC Symposium, Philadelphia, Pa., Oct. 16–19, 1994.

J. C. Zolper et al., "A Self–Aligned Zn–Gate GaAs JFET by Ion Implantation," presented at the 1993 International Semiconductor Device Research Symposium, Charlottesville, Va., Dec. 1–3, 1993.

M. Ino et al., "III–V High–Speed ICs" in *High–Speed Digital IC Technologies*, M. Rocchi, ed. [Artech House, 1990], pp. 181–264.

R. A. Kiehl et al., "The Potential of Complimentary Heterostructure FET IC's," *IEEE Transactions on Electron Devices*, vol. ED–34, pp. 2412–2421, Dec. 1987.

J. K. Abrokwah et al., "Anisotype–Gate Self–Aligned p–Channel Heterostructure Field–Effect Transistors," *IEEE Transactions on Electron Devices*, vol. 40, pp. 278–283, Feb. 1993.

P. P. Ruden et al., "Quantum–Well p–Channel AlGaAs/InGaAs/GaAs Heterostructure Insulated–Gate Field–Effect Transistors," *IEEE Transactions on Electron Devices*, vol. 36, pp. 2371–2379, Nov. 1989.

P. P. Ruden et al., "High Performance Complimentary Logic Based on GaAs/InGaAs/AlGaAs HIGFETs," *Proceedings of the International Electron Devices Meeting*, [IEEE, 1989], pp. 117–120.

R. R. Daniels et al., "Quantum–Well p–Channel AlGaAs/InGaAs/GaAs Heterostructure Insulated–Gate Field Effect Transistors with Very High Transconductance," *IEEE Electron Device Letters*, vol. 9, pp. 355–357, Jul. 1988.

(List continued on next page.)

*Primary Examiner*—Wael M. Fahmy
*Attorney, Agent, or Firm*—John Hohimer; Gregory A. Cone

[57] ABSTRACT

A complimentary pair of compound semiconductor junction heterostructure field-effect transistors and a method for their manufacture are disclosed. The p-channel junction heterostructure field-effect transistor uses a strained layer to split the degeneracy of the valence band for a greatly improved hole mobility and speed. The n-channel device is formed by a compatible process after removing the strained layer. In this manner, both types of transistors may be independently optimized. Ion implantation is used to form the transistor active and isolation regions for both types of complimentary devices. The invention has uses for the development of low power, high-speed digital integrated circuits.

12 Claims, 10 Drawing Sheets

OTHER PUBLICATIONS

R. R. Daniels et al., "Complimentary Heterostructure Insulated Gate FET Circuits for High–Speed, Low Power VLSI," *Proceedings of the International Electron Devices Meeting*, [IEEE, 1986], pp. 448–451.

N. C. Cirillo, Jr. et al., "Complimentary Heterostructure Insulated Gate Field Effect Transistors (HIGFETs)," *Proceedings of the International Electron Devices Meeting*, [IEEE, 1985], pp. 317–320.

N. C. Cirillo, Jr. et al., "Realization of n–Channel and p–Channel High–Mobility (Al,Ga)As/GaAs Heterostructure Insulating Gate FET's on a Planar Wafer Surface," *IEEE Electron Device Letters*, vol. EDL–6, pp. 645–647, Dec. 1985.

C.–P. Lee et al., "High–Transconductance p–Channel InGaAs/AlGaAs Modulation–Doped Field Effect Transistors," *IEEE Electron Device Letters*, vol. EDL–8, pp. 85–87, Mar. 1987.

T. Mizutani et al., "Complimentary Circuit with AlGaAs/GaAs Heterostructure MISFETs Employing High–Mobility Two–Dimensional Electron and Hole Gases," *Electronics Letters*, vol. 21, pp. 1116–1117, 7 Nov. 1985.

COMPLEMENTARY JUNCTION HETEROSTRUCTURE FIELD-EFFECT TRANSISTOR

This invention was made with Government support under Contract No. DE-AC0494AL85000 awarded by the U.S. Department of Energy. The Government has certain rights in the invention.

FIELD OF THE INVENTION

The present invention relates to complimentary junction heterostructure field-effect transistors (C-JHFETs) formed from III-V compound semiconductors and to a method for their manufacture. The present invention may also be applied to the formation of high-speed integrated circuits (ICs) comprising a plurality of C-JHFET devices.

BACKGROUND OF THE INVENTION

Complimentary metal-oxide semiconductor (CMOS) transistors formed in silicon have been a dominant technology for modem electronics since they have a very low power consumption and may be easily manufactured. However, the speed of silicon CMOS is limited so that high speed electronic applications are currently being served by the niche technologies silicon emitter-coupled logic (Si ECL) and n-channel GaAs. Both of these niche technologies are high speed, high power consumption technologies, that are costly relative to silicon CMOS; and they provide a level of integration reminiscent of the silicon technology of the early 1980's. There is no current IC production technology that offers at the same time high-speed performance, high levels of integration, and low power consumption.

A compound semiconductor analog of CMOS technology such as a complimentary GaAs FET technology has the potential to achieve high-speed performance with a low power consumption. However, the attainment of a viable GaAs FET technology has been slow in coming due to the very large difference in electron and hole mobilities in III-V compound semiconductors. The electron mobility in an n-channel GaAs FET, for example, is approximately six times higher than that of a silicon CMOS transistor; but the hole mobility in a p-channel GaAs FET is only about the same as that for silicon. Since the performance of a complimentary IC is related to an average of the electron and hole transport properties, GaAs and other III-V complimentary ICs have a potential advantage over silicon CMOS ICs; but this advantage can be improved significantly by the development of a high-mobility p-channel FET.

A viable complimentary III-V IC technology is needed to allow the fabrication of n- and p-channel FETs on a single substrate in a straightforward manner. Such a complimentary III-V IC technology will result in an extremely low static power consumption; and it will allow the use of many circuit design tricks developed for silicon CMOS ICs that minimize the number of transistors required to obtain a given level of functionality. The realization of a high level of integration with a compound semiconductor IC technology can only be realized if the transistor gate and subthreshold currents are reduced to a sufficiently low level.

In the prior art development of conventional (i.e. bulk) complimentary GaAs transistors such as junction FETs (JFETs), most of the speed advantage over silicon is lost since the mobility of holes in bulk GaAs is no better than that in silicon. This low value of the hole mobility (about 200 $cm^2$/V-s at room temperature) results in a low p-channel transconductance, $g_m$, of about 5 mS/mm, and therefore a low switching speed. This p-channel transconductance is about an order of magnitude lower than that of the prior art complimentary conventional n-channel JFET devices, indicating the need for a substantial improvement in the JFET technology before it is viable for wide spread IC use.

In the prior art conventional GaAs metal-semiconductor FET (MESFET), the p-channel transconductance is limited by the bulk hole mobility, as in the case of a conventional p-channel JFET. For MESFETs, the p-channel drive current is therefore about twenty times less and the gate turn-on voltage is lower than for a complimentary n-channel GaAs MESFET. Published research approaches to solving these and other problems with prior art GaAs MESFETs have addressed isolated individual aspects of the problem with no overall approach to device optimization to meet the requirements for complimentary logic circuits. At least three separate areas of concern exist in the prior art GaAs MESFET technology: a satisfactory performance of the p-channel MESFET has not been maintained with a low gate leakage current, with a low subthreshold current, and with compatible processing of an n-channel transistor having the desired characteristics.

The achievement of enhanced transconductance in p-channel AlGaAs/GaAs modulation-doped FETs (MODFETs) and the demonstration of high-speed switching in p-channel MODFET ring oscillator circuits has focused attention on various complimentary heterostructure FET (C-HFET) approaches. A common feature of the various prior art C-HFET approaches is that they make use of the enhanced mobility for holes confined in an undoped region at the interface of an AlGaAs/GaAs heterostructure to achieve improved performance, particularly at low temperatures (77 K.). C-HFETs are the subject of an article entitled *"The Potential of Complimentary Heterostructure FET ICs"* by R. A. Kiehl, M. A. Scontras, D. J. Widiger, and W. M. Kwapien in IEEE Transactions on Electron Devices, volume ED-34, pages 2412–242, December 1987. A more recent discussion of the various approaches for III–V high speed ICs may be found in a book entitled *"High-Speed Digital IC Technologies"* edited by M. Rocchi, chapter 5, pages 181–264, published by Artech House, 1990.

C-HFETs are Schottky-gate FETs in which the conducting path is a two-dimensional hole (or electron) gas at the heterointerface between a highly doped wide-bandgap material (AlGaAs) and an undoped smaller-bandgap material (GaAs). The prior art p-channel HFETs show improved performance, particularly at low temperatures (77 K.); but the room-temperature (i.e. 300 K.) performance has been disappointing. The greatest limitation of present C-HFETs is excessively high leakage current at room temperature. A high leakage current increases the static power dissipation and reduces the number of devices that can be incorporated into an IC. The progress in the development of C-HFETs to date has been slow; and these devices have yet to meet acceptable design constraints with regard to threshold voltages and gate leakage currents.

A novel form of C-HFET termed a semiconductor-insulator-semiconductor FET (SISFET) or a heterostructure insulated gate FET (HIGFET) is potentially less sensitive to process variations than conventional C-HFETs because the transistor threshold is largely independent of the distance between the electrons and the gate. Reasonable progress has been made in the development of complimentary HIGFETs (C-HIGFETs) with high performance. C-HIGFET technology offers high performance p- and n-channel devices that use the same InGaAs channel for device design and fabrication simplicity. The use of a common epitaxy for both the p- and n-channel devices, however, results in trade-offs and conflicting design and processing requirements.

Common limitations of the insulated-gate approaches, also termed metal insulator semiconductor (MIS) devices, include higher transistor threshold voltages and an inability to independently adjust the threshold voltage of both n- and p-channel transistors. The resultant IC operation at higher voltages results in inherently higher dynamic power consumption than the C-JHFET approach of the present invention, because the dynamic power dissipation increases as the square of the power supply voltage.

The present invention uses a complimentary JFET technology that uses a different epitaxial layer structure in the p- and n-channel transistors, thereby allowing each device to be independently optimized for high performance and ease of manufacture.

Many different types of complimentary FETs in silicon and GaAs have been patented, and these patents are summarized below:

U.S. Pat. No. 4,811,075 discloses a high voltage metal-oxide semiconductor field-effect transistor (MOSFET) in silicon that can be made either as a discrete or as an integrated device having either n-channel or p-channel conductivity. These high voltage (up to 300 volts capability) transistors are formed by connecting an insulated gate field-effect transistor (FET) and a double-sided junction gate field-effect transistor (JFET) in series. Devices of opposite conductivity may be combined in a complimentary manner on the same chip. MOSFET devices cannot be formed in GaAs and other compound semiconductors since native oxides do not exist for these materials as in silicon.

U.S. Pat. No. 5,122,851 discloses a trench gate JFET transistor in silicon suitable for use in interfacing large numbers of photodetectors with associated circuitry as in an infrared array image detector. The gate in this invention is recessed in a trench formed in the substrate between a drain and source region. The trench is preferably of sufficiently depth to mitigate the generation of 1/f noise in the transistor. Devices of opposite conductivities may be combined in a complimentary manner on the same substrate. U.S. Pat. No. 5,010,025 discloses a method for forming the above trench-gate JFET device. The gates of the present invention are not recessed in a trench as in the above patents (although the entire n-channel transistor of the present invention is formed in a trench for reasons of ease of manufacture rather than to reduce 1/f noise).

U.S. Pat. No. 4,117,587 discloses a negative resistance semiconductor device formed by interconnecting in series two complimentary JFETs with the gate of each device connected to the drain of the other device of the opposite conductivity type. The result is a two-terminal circuit device that exhibits a current-versus-voltage characteristic having a negative resistance region. The present invention comprises more than two terminals and does not show a negative resistance characteristic.

U.S. Pat. No. 5,130,770 discloses a JFET formed by a silicon-on-insulator technology. The drain and source of the JFET are formed on a semiconducting island supported by an electrically insulating layer that is preferably $SiO_2$. Semiconductor oxides are not used in the formation of compound semiconductor devices as in the present invention.

U.S. Pat. No. 5,031,007 discloses complimentary FETs formed from a compound semiconductor strained-layer superlattice comprising a plurality of alternating layers of two different semiconductor materials, one forming quantum-well layers and the other forming barrier layers. The strained layer superlattice increases the hole mobility by splitting the degeneracy of the valence band over that of the material in bulk form. The p-channel transistor in the present invention uses at least one strained quantum-well layer to increase the hole mobility by splitting the valence band degeneracy; and no strained layers or quantum wells are present in the complimentary n-channel transistor in the present invention.

U.S. Pat. No. 5,142,349 discloses a C-HFET device that attempts to solve a problem with conventional HFETs due to a mismatch in the p- and n-channel threshold voltage and operating characteristics. This invention uses multiple electrically isolated vertically aligned channels to form a plurality of vertically stacked FETs with the channel regions controlled by a single gate electrode. In the preferred embodiments of this invention, aluminum antimonide (AlSb) and gallium antimonide (GaSb) am preferably used for the p-channel devices and indium arsenide (InAs) and AlSb or the complimentary n-channel devices.

U.S. Pat. No. 5,243,206 discloses a heterostructure field-effect transistor structure having vertically stacked complimentary n- and p-channel devices. The n- and p-channel transistors share a common gate electrode with the n and p channels positioned parallel to each other and vertically spaced by a predetermined separator thickness. Although this vertically stacked design is intended to dramatically reduce the chip size of compound semiconductors and increase the device packing density, it does so at the expense of a more complicated epitaxy and an increased manufacturing difficulty. The n- and p-channel transistors are not capable of independent operation due to the common gate electrode. A positive voltage on the gate turns the n-channel transistor on while simultaneously turning the p-channel off. This mode of operation may be advantageous for certain applications; but it is more restrictive than one in which the n- and p-channel transistors are completely independent as in the present invention.

U.S. Pat. No. 5,060,031 discloses a complimentary heterojunction field-effect transistor with an anisotype $n^+$ gate for p-channel devices. The heavily n-doped anisotype layer underneath the gate electrode forms a semiconductor junction that replaces or augments a Schottky-barrier junction for the purpose of increasing the p-channel turn-on voltage to nearly 1.7 volts. In this prior art complimentary HFET, a common channel (preferably InGaAs) is used for both n-channel and p-channel transistors. The use of a common epitaxy for both n- and p-channel transistors results in some layers that are common to both transistors, and limits the ability to independently optimize each transistor's characteristics.

A primary concern in the design of compound semiconductor complimentary field-effect transistors is the structure of the channel region underneath the gate electrode since the channel region performance largely determines the overall performance of the transistor. This is especially true of p-channel transistors.

An advantage of the complimentary junction heterostructure field-effect transistor (C-JHFET) of the present invention is that bandgap engineering by means of heteroepitaxy may be used to optimize the performance and speed of the p-channel device, and to dramatically increase it over prior art p-channel MESFET and HFET devices.

Another advantage of the C-JHFET of the present invention is that once the design of the p-channel device is optimized, a complimentary n-channel device may be formed in a compatible manner.

These and other advantages of the C-JHFET will become evident to those skilled in the art.

SUMMARY OF THE INVENTION

It is a primary object of the present invention to obviate the problems of the prior art complimentary III–V field-effect transistors.

Another object of the present invention to provide a III–V integrated circuit wherein the p-channel transistor is optimized to provide current drive for a unit of device width and device size approaching that of an n-channel device.

Another object of the invention is to provide a III–V integrated circuit wherein bandgap engineering by means of heteroepitaxy improves the mobility of the p-channel transistor.

An additional object of the invention is to provide a III–V integrated circuit wherein crystal lattice strain is used to split the degeneracy of the light and heavy hole bands to improve the transport in the light hole band.

Still another object of the invention is to provide a III–V integrated circuit wherein the strained quantum-well layer is thermodynamically stable and compatible with high temperature processing requirements.

Another object of the invention is to form an n-channel FET by ion implantation and a complimentary p-channel FET by heteroepitaxy, to obtain a high level of performance in both devices.

Still another object of the invention is to form a p-channel FET with enhanced mobility, and to form a complimentary n-channel FET by a compatible process.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a pair of complimentary junction heterostructure field-effect transistors is provided on a common III–V semiconductor substrate, and a method for their manufacture is described.

Additional objects, advantages, and novel features of the invention will become apparent to those skilled in the art upon examination of the following detailed description when considered in conjunction with the accompanying drawings. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

Figure 1:
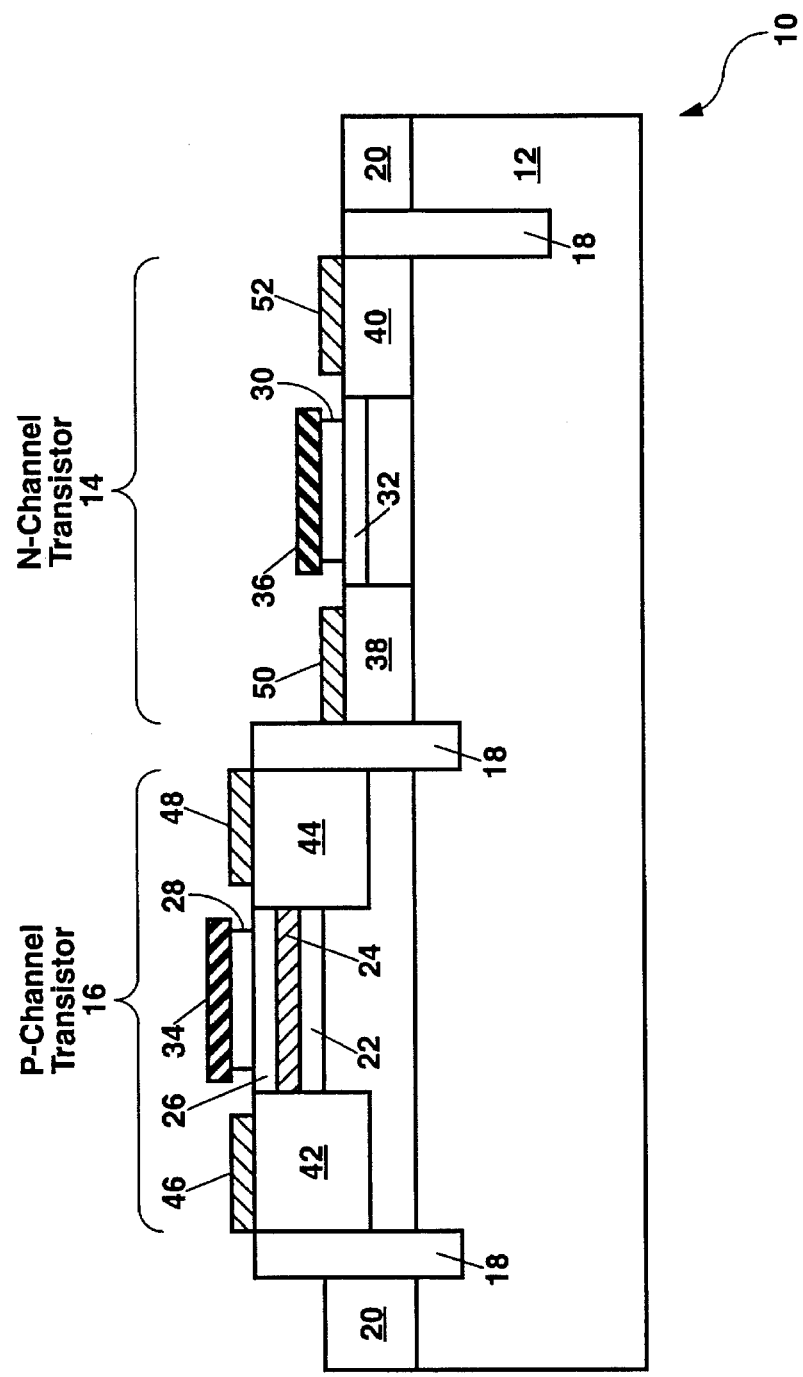
FIG. 1 is a cross-sectional view of an integrated circuit 10 comprising a complimentary n- and p-channel junction heterostructure field transistors according to the present invention.

Those structures depicted in the drawings are arranged for illustrative purposes and therefore are distorted in their proportions. The thickness of the semiconductor substrate is chosen on the basis of convenience for manufacture, and is not significant in the operation of the transistors other than as a thermal heat sink and mechanical support. The size of the transistors is determined by the semiconductor processing capabilities and the required operating characteristics.

DETAILED DESCRIPTION OF THE INVENTION

FIG. 1 illustrates a highly simplified cross-section through channel regions above a complimentary junction field-effect transistor integrated circuit in accordance with the present invention. All material layers in FIG. 1 are substantially single crystal epitaxially grown layers. This requires that each epitaxial layer comprise a material that is crystallographically compatible with an underlying substrate. The epitaxial layers of the present invention may be grew by molecular beam epitaxy (MBE), metal-organic chemical vapor deposition (MOCVD), atomic layer epitaxy (ALE), or the like.

The integrated circuit 10 of the present invention, shown schematically in FIG. 1, comprises: a semiconductor substrate 12, at least one n-channel junction heterostructure field-effect transistor (JHFET) 14 formed on the substrate, at least one p-channel JHFET 16 formed on the substrate, and at least one isolation region 18.

In FIG. 1, the substrate 12 is a III–V compound semiconductor, preferably semi-insulating gallium arsenide (GaAs). Since the limiting factor in forming a complimentary compound semiconductor IC 10 is the performance of the p-channel transistor 16, a series of epitaxial layers are grown on the substrate for use in the formation of a high-performance p-channel transistor. The n-channel transistor 14 is then made in a manner that is compatible with and that does not degrade the performance of the p-channel transistor 16.

A strained quantum-well channel represents the best known method for improving the transport of the p-channel transistor 16. This is especially so because modulation doping has not been widely studied for p-channel field-effect transistors; and it may be difficult to obtain the optimum charge modulation required for a successful p-channel MODFET.

A process sequence for forming the complimentary n- and p-channel JHFET transistors of the present invention is described with reference to FIGS. 2–10.

Figure 2:
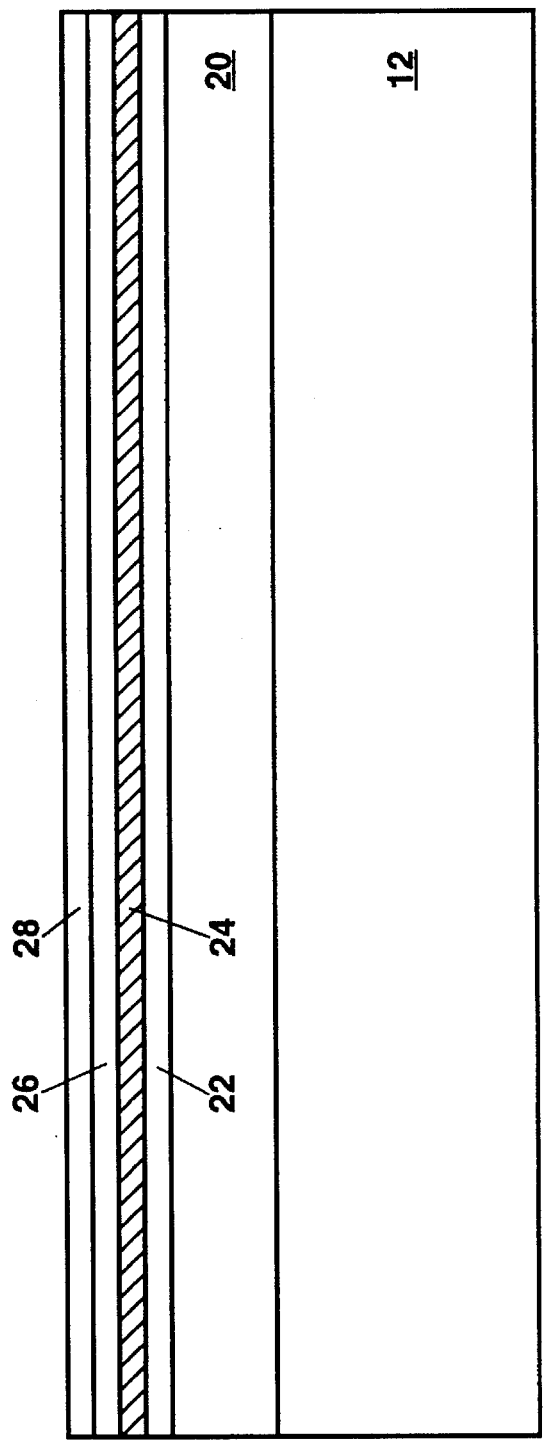
FIGS. 2–10 are cross-sectional views illustrating the construction of an integrated circuit 10 of complmentary n- and p-channel junction heterostructure field-effect transistors according to the present invention.

In preparing the substrate 12 prior to the fabrication of the IC 10, a device region is formed by growing a plurality of epitaxial layers on the substrate as shown in FIG. 2, beginning with a buffer layer 20. The buffer layer 20 may be, for example, a semi-insulating (i.e. not intentionally doped) GaAs layer about 1 micron thick.

The buffer layer 20 preferably includes a leakage barrier 22 to reduce carrier leakage from the p-channel transistor. The leakage barrier 22 may be in the form of a semiconductor p-n junction, or it may be a higher-bandgap material. A p-n junction leakage barrier 22 may be formed, for example, by growing about 75 nm of n-doped (about $5 \times 10^{17}$ $cm^{-3}$ Si) GaAs upon the semi-insulating GaAs, followed by the growth of about 15 nm of p-doped (about $1.5 \times 10^{18}$ $cm^{-3}$ Be) GaAs and about 10 nm of semi-insulating GaAs. A p-n junction leakage barrier 22 may also be used in forming the gate and channel regions of the n-channel transistor 14. The leakage barrier 22 may also be designed to improve the modulation doping efficiency by doping the strained quantum-well channel 24 from both the front (i.e. top) and back (i.e. bottom) sides. A higher-bandgap leakage barrier 22 may be formed, for example, by growing a layer of a material having an energy bandgap higher than that of the strained quantum-well channel 24. For example, the leakage barrier 22 may be grown with about 10 nm undoped aluminum gallium arsenide ($Al_xGa_{1-x}As$) having an aluminum composition of about 30% (i.e. x=0.3), upon which is grown about 10 nm of semi-insulating GaAs. The higher-bandgap leakage barrier 22 may also become a part of the n-channel transistor to improve the p-n junction forward turn-on voltage. The leakage barrier 22 may be designed as a fully depleted $n^+$ layer to form a junction camel diode. The leakage barrier 22 may be doped to form a modulation-doping layer to provide backside modulation doping of the channel, thereby allowing the use of a smaller gate to channel spacing and increasing the maximum transistor drain-to-source current that may be controlled.

At least one strained quantum-well layer 24 is epitaxially grown above the leakage barrier 22 in FIG. 2. The strained quantum-well layer used in forming the first conducting channel 24 is preferably indium gallium arsenide. The thickness and indium content of the strained quantum-well layer 24 are chosen to provide sufficient crystal lattice strain to split the degeneracy of the valence band to enhance the transport characteristics of the p-channel transistor 16; but of a value low enough to be thermally stable at the high temperatures (about 800° C. for about 15 seconds) used for rapid thermal annealing to activate the ion implants; or of a value low enough for the strain to be compensated by an overlying strain-compensation layer. For example, the strained quantum-well layer 24 may be undoped with an indium composition of about 15% and a thickness of about 10 nm. The strained quantum-well layer 24 forms the first conducting channel 24 of the p-channel transistor 16 in FIG. 1.

In FIG. 2, above the first channel 24 is grown a higher-bandgap layer 26. The higher-bandgap layer 26 may be, for example, an aluminum gallium arsenide ($Al_xGa_{1-x}As$) layer with an aluminum composition of about 35% (i.e. x=0.35) and a thickness of about 20 nm. Although, the higher-bandgap layer 26 is substantially p-doped (to about $5 \times 10^{18}$ $cm^{-3}$), a portion of the higher-bandgap layer 26 grown in direct contact with the strained quantum-well layer 24 may be semi-insulating (for example, the first 5 nm) to better separate the ionized acceptors from the holes in the channel. The thickness of the semi-insulating portion of the higher-bandgap layer 26 is chosen to efficiently modulate the first conducting channel 24.

The higher-bandgap layer 26 may also include a strain compensation region (i.e. a layer of a material having strain characteristics in the opposite sense to that of the first channel 24) to balance the strain of the first conducting channel 24, and to allow the use of a higher local strain in the first conducting channel 24. An advantage of using a strain-compensation higher-bandgap layer 26 is that it allows the use of a thicker strained quantum-well channel (i.e. the first conducting channel 24) to satisfy the thermal stability requirements of high temperature IC processing. Other compound semiconductor p-channel FET designs in the prior art have either sacrificed performance or thermal stability; and none of the prior art p-channel FET designs have optimized both thermal stability and performance. Furthermore, none of the prior-art p-channel FET designs utilize both front and backside modulation doping because of incompatability with fabrication of the n-channel transistor. The higher-bandgap layer 26 acts in combination with the first conducting channel 24 to generate a two-dimensional hole gas in the first channel to enhance the mobility of the p-channel JHFET 16.

In FIG. 2, above the higher-bandgap layer 26 is grown a first gate layer 28. The first gate 28 forms the junction gate on the p-channel FET 16. The first gate layer 28 may be, for example, n-doped GaAs (allout $5 \times 10^{18}$ $cm^{-3}$ Si) with a thickness of about 50 nm.

Figure 3:
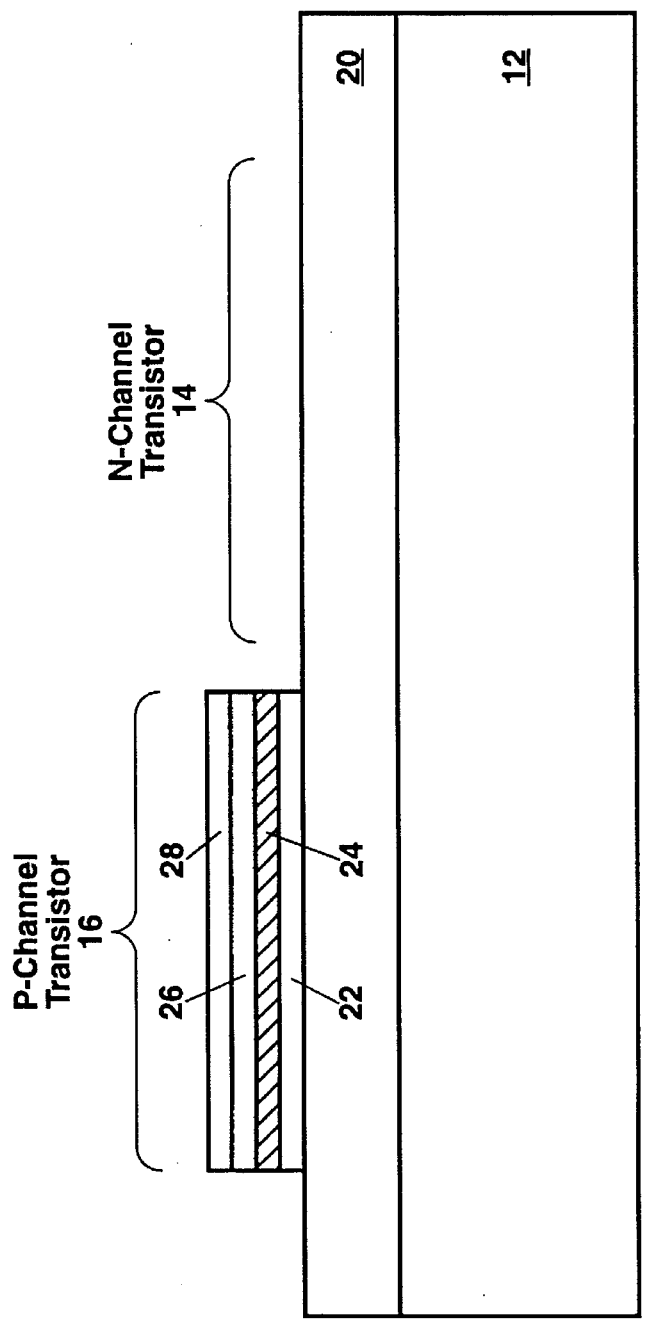

In FIG. 3, at least one mesa region (i.e. a p-mesa) is formed on the substrate 12 to fabricate at least one p-channel transistor 16 after the epitaxial growth step in FIG. 2. This p-mesa etch step may be performed with conventional semiconductor processing. For example, a patterned photoresist mask may be formed on the substrate 12, and material in the mask openings etched down to the buffer layer 20 (or to the leakage barrier 22 if suitably designed to provide a p-n junction for the n-channel JHFET) with a 1:4:45 solution of $H_3PO_4:H_2O_2:H_2O$. The etched wells or trenches formed in this manner adjacent to the p-mesas may be designed so as to provide selected locations for the formation of the complimentary n-channel JHFETs 14 in the buffer layer 20. This single mask and etching step allows the production of both enhancement and depletion mode n-channel JHFETs 14 on the same IC 10 as the p-channel JHFETs 16.

The n-channel JHFET 14 is preferably fabricated by ion implantation in the epitaxial buffer layer 20. (Although the n-channel transistor is called a JHFET, it should be more properly termed a JFET when the region of the buffer layer 20 in which the n-channel transistor is formed does not include a semiconductor heterostructure.) The ion implantation approach is an advantage of the present invention since it allows the full flexibility of the epitaxy to improve the p-channel device, which is the weak link in compound semiconductor materials. The fully ion implanted n-channel JHFET 14 preferably uses a junction gate in order to achieve a reasonably high gate turn-on voltage of about 1 volt.

Junction field-effect transistors are used in the n-channel JHFET of IC 10 since they represent a fully ion implanted approach that meets all of the circuit requirements of complimentary logic. The n-channel JHFET 14 is fully compatible with a thermally stable, high-performance p-JHFET device 16.

Figure 4:
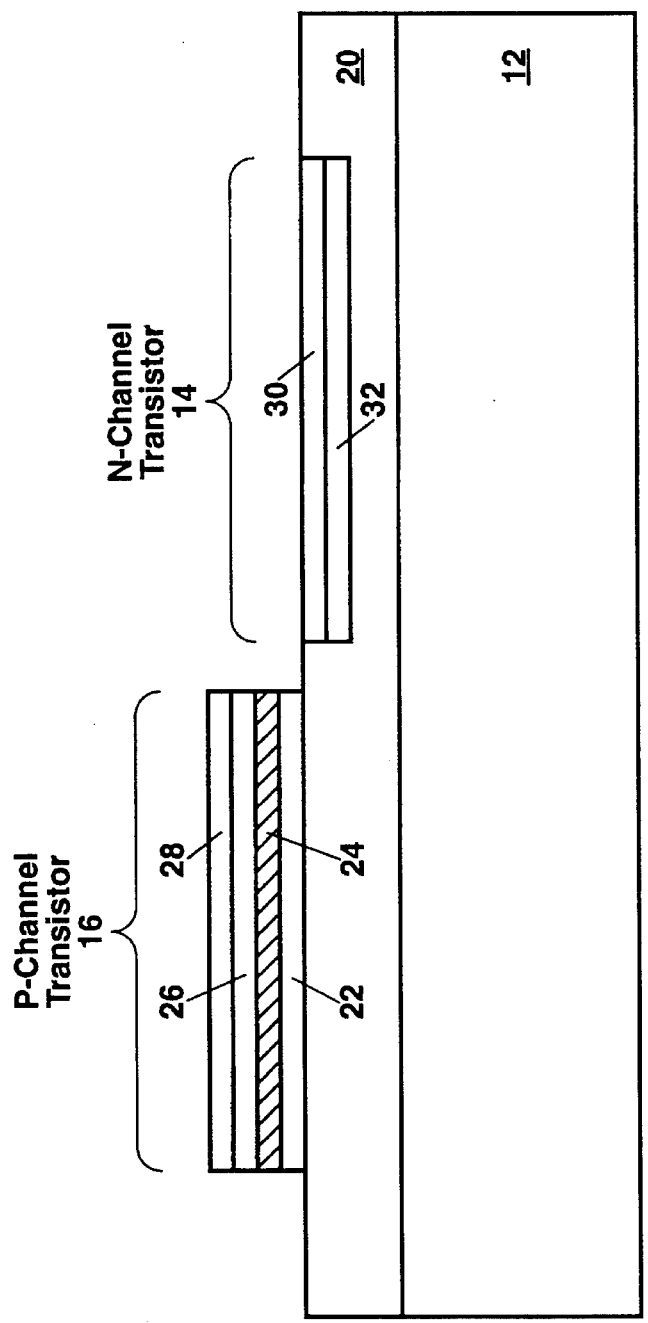

FIG. 4 shows a first ion implantation step performed after the p-mesa etch step in FIG. 3. This first ion implantation step is used for the formation of at least one complimentary n-channel JHFET 14. This step proceeds with an initial n-channel implant and a subsequent lower-energy p$^+$ implant. The n-channel implanted ion is preferably Si at an energy of about 70 keV and a dosage of about $1.5 \times 10^{13}$ cm$^{-2}$. The subsequent p$^+$ implanted ion is preferably Zn at an energy of about 45 keV and a dosage of about $3 \times 10^{14}$ cm$^{-2}$. The p$^+$ implant forms the second gate 30 and the n$^+$ implant forms the second conducting channel 32 of the n-channel transistor 14. The n-channel JHFET may include other ion implantation steps as known to the art for compound semiconductors, including those used in prior-art MESFETs. These implantation steps may be used to improve the backside confinement, and may include, for example, a deep Mg ion implant at an energy of 210 keV and a dosage of about $1.5 \times 10^{12}$ cm$^{-2}$. These additional implantation steps may also include co-implantation of a group V material coincident with the profile of the shallow p$^+$ implant to reduce interdiffusion of the p$^+$ and n layers. This co-implantation may be, for example, P$_2$ co-implanted at 45 keV at a dosage of about $3 \times 10^{14}$ cm$^{-2}$.

Figure 5:
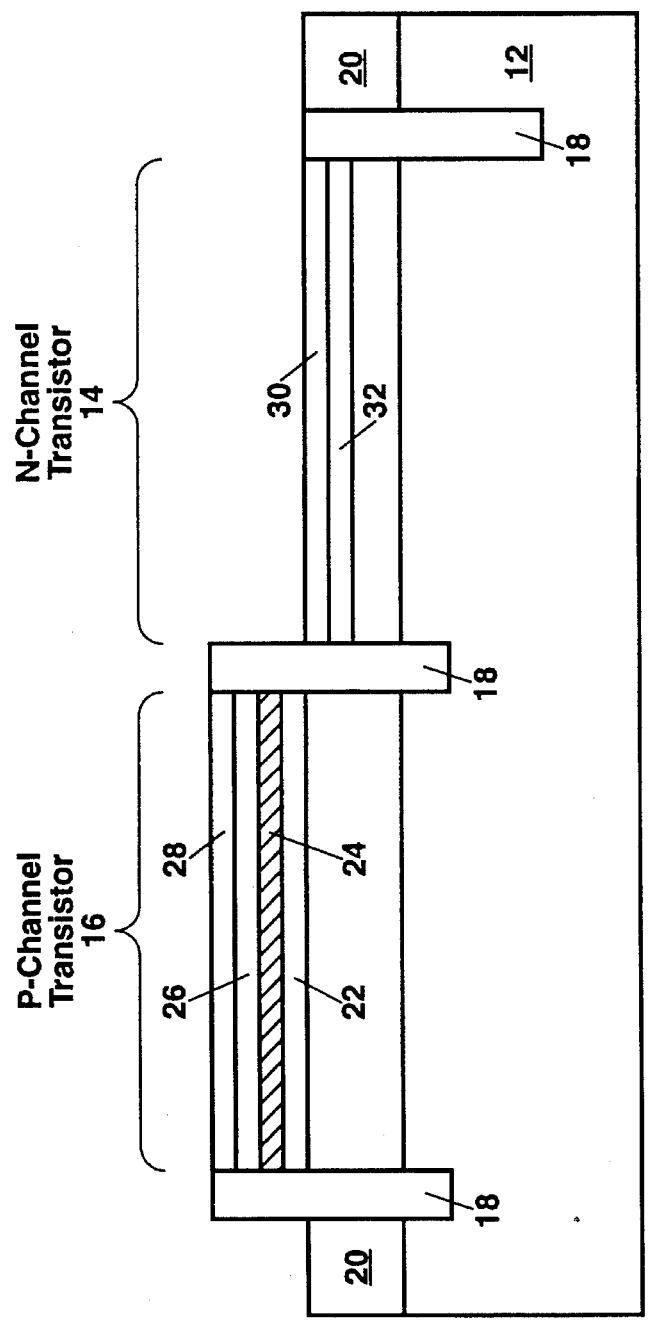

FIG. 5 shows an isolation step performed after the first ion implantation step in FIG. 4. This isolation step, preferably performed by ion implantation, forms at least one isolation region 18 in the substrate 12 around a transistor to electrically isolate that transistor from adjacent transistors. The isolation step may be performed, for example, by ion implanting oxygen at 40 and 120 keV at a dosage of $1 \times 10^{14}$ cm$^{-2}$ for each implant. Oxygen implantation is a well-known isolation technique used in compound semiconductors; it is thermally stable in the embodiments of the present invention at high temperatures; and it is capable of reducing the parasitic capacitances under the gate contacts outside the active areas. Oxygen implantation is used to isolate other regions of the IC 10 where desired. Oxygen implantation may also be performed at an earlier step with the same benefits in terms of reducing parasitic capacitances of the gate electrodes, or at a later step in the fabrication sequence in which case the parasitic capacitance under the gate electrodes is unchanged.

Figure 6:
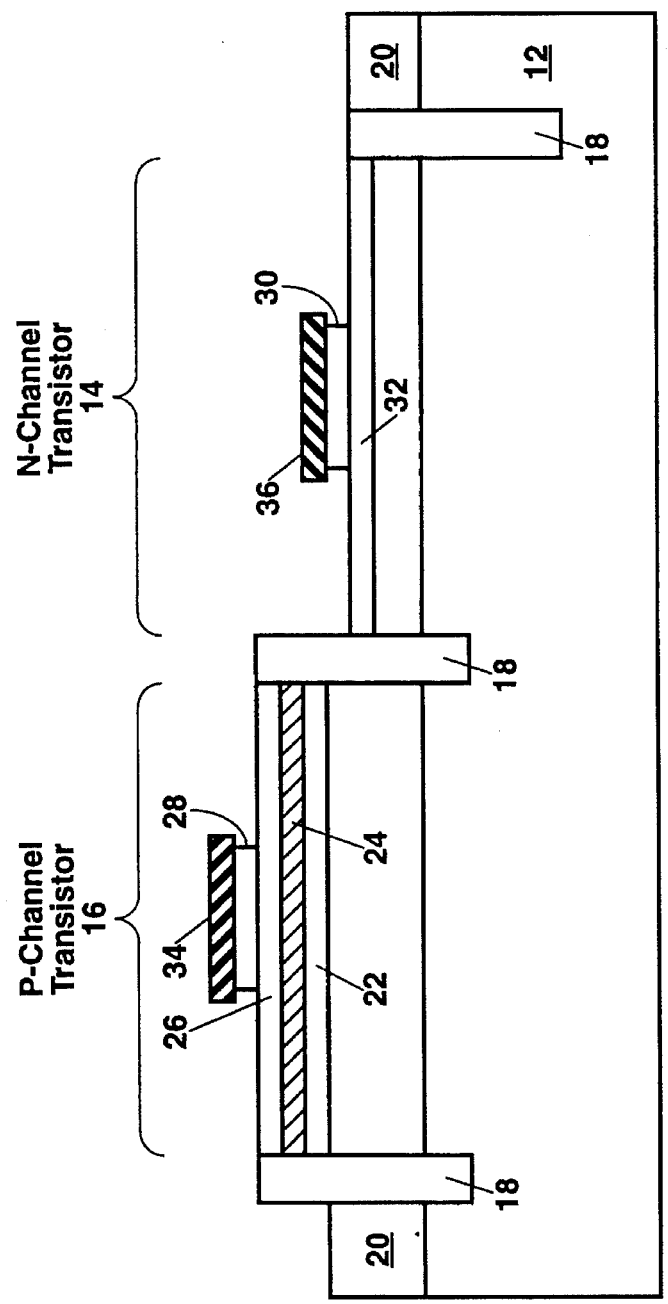

FIG. 6 shows a refractory gate electrode formation and drain/source etch step performed after the isolation step in FIG. 5. The refractory gate electrode material is deposited (for example, by sputter deposition) over the substrate 12 and patterned by reactive ion etching (for example, in a plasma of SF$_6$, CHF$_3$, and O$_2$) to form the first gate electrode 34 on the p-channel transistor 16 and the second gate electrode 36 on the n-channel transistor 14. The gate electrode material may be, for example, tungsten or tungsten silicide. The electrode metal thickness is preferably about 300 nm for a tungsten gate electrode material, and about 400 nm for tungsten silicide. The electrical gates of the transistors are the p-n junctions with the refractory gate electrodes serving as a self-aligned etch and implant mask.

Following gate metal patterning, a wet etch (for example, a 5:1 solution of citric acid and 30% hydrogen peroxide) is used to remove the heavily doped semiconductor gate material from the source and drain regions before ion implanting. The wet etching serves multiple purposes: it undercuts the gates 28 and 30 slightly to reduce the gate capacitance, it forms a T-shaped gate profile that spaces the p-n junction gate away from the source and drain implants, and it simplifies the formation of the heavily doped self-aligned source and drain regions. The gate length for both the n- and p-channel gates is about 1 micron.

Figure 7:
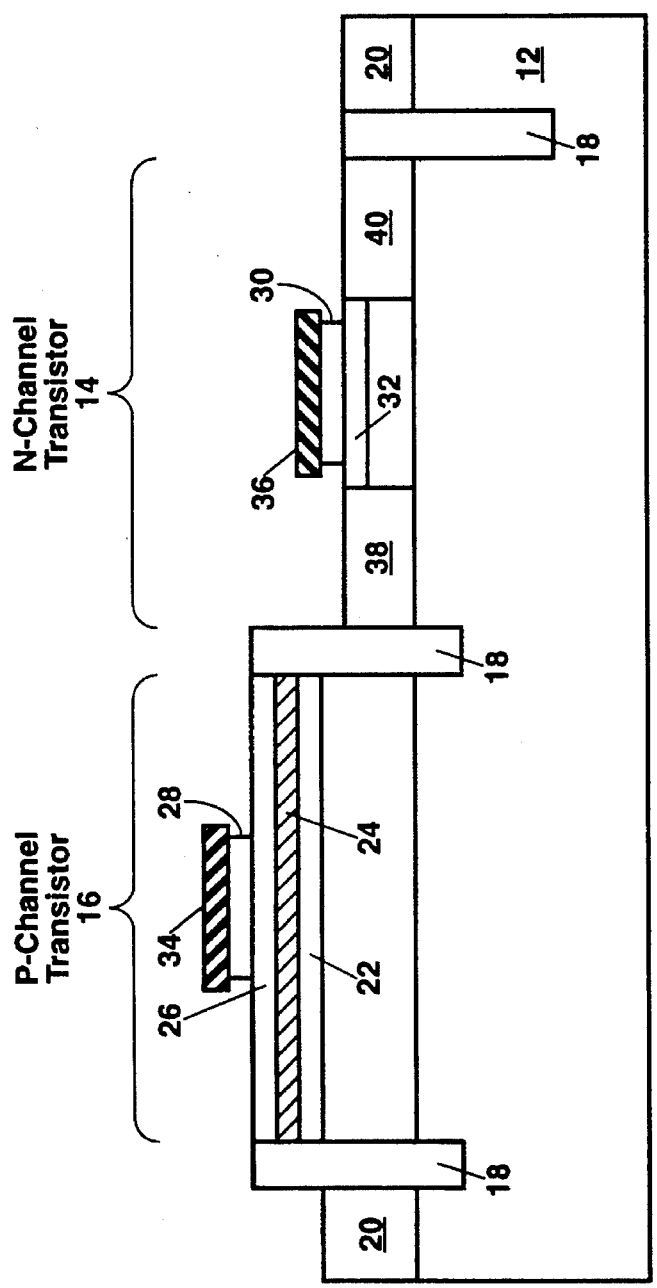

Once the gate metal patterning step in FIG. 6 is complete, the drain and source regions of the n-channel transistor are formed by ion implantation as shown in FIG. 7. The second drain 38 and second source 40 of the n-channel transistor 14 are formed after protecting the p-channel transistor 16 with a patterned photoresist mask. This n$^+$ implant step may be performed for example by implanting Si at energies of 40 and 80 keV with a dosage of $2 \times 10^{13}$ cm$^{-2}$ for each implant, and using the self-aligned second gate electrode 36 as an implant mask.

Figure 8:
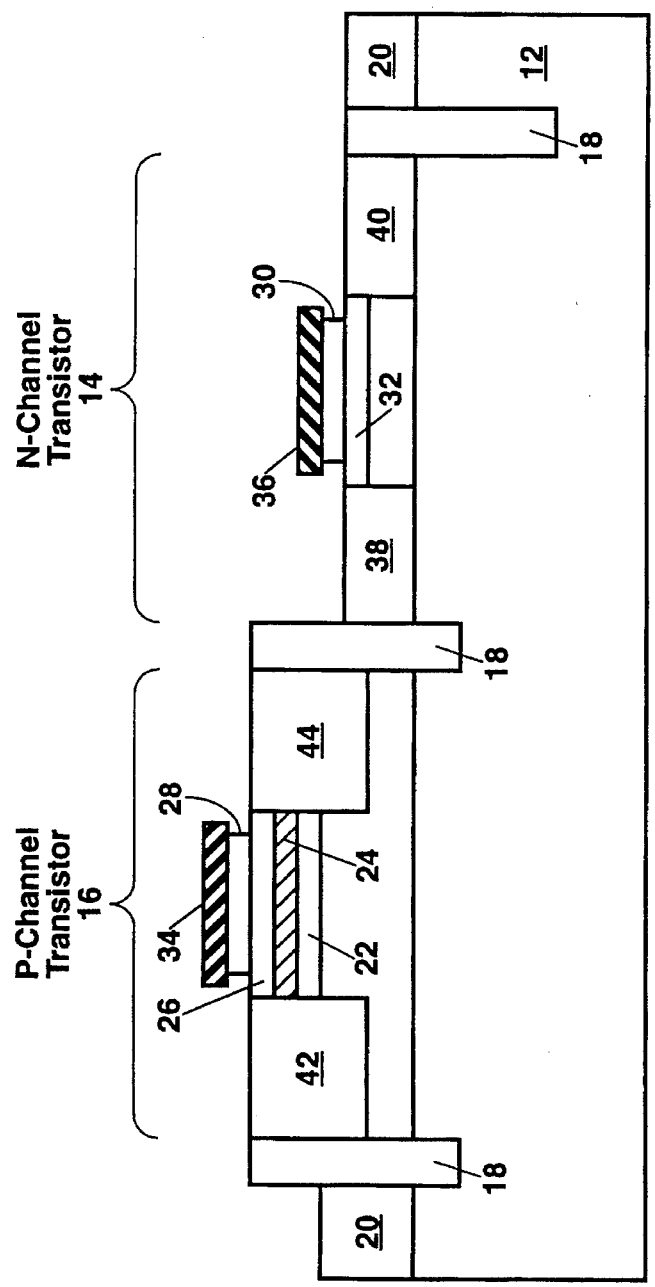

After the n$^+$ implant step of FIG. 7, the drain and source regions of the p-channel transistor are formed by ion implantation as shown in FIG. 8 and the implants annealed. This step forms the first drain 42 and the first source 44 of the p-channel transistor 16. During this step, the n-channel transistor 14 is protected by a patterned photoresist mask, and the selfaligned first gate electrode 34 is used as the implant mask for the drain and source regions. This p$^+$ implant step may be performed for example by implanting Zn at energies of 40 and 80 keV with a dosage of $1 \times 10^{14}$ cm$^{-2}$ for each implant. Following the p$^+$ implant, the n$^+$ and p$^+$ implants are activated by rapid thermal annealing at about 800° C. for about 15 seconds. Separate implant activation steps may also be performed for n$^+$ and p$^+$ activation, respectively. The order of the n$^+$ and p$^+$ implants may be reversed from that outlined herein.

Figure 9:
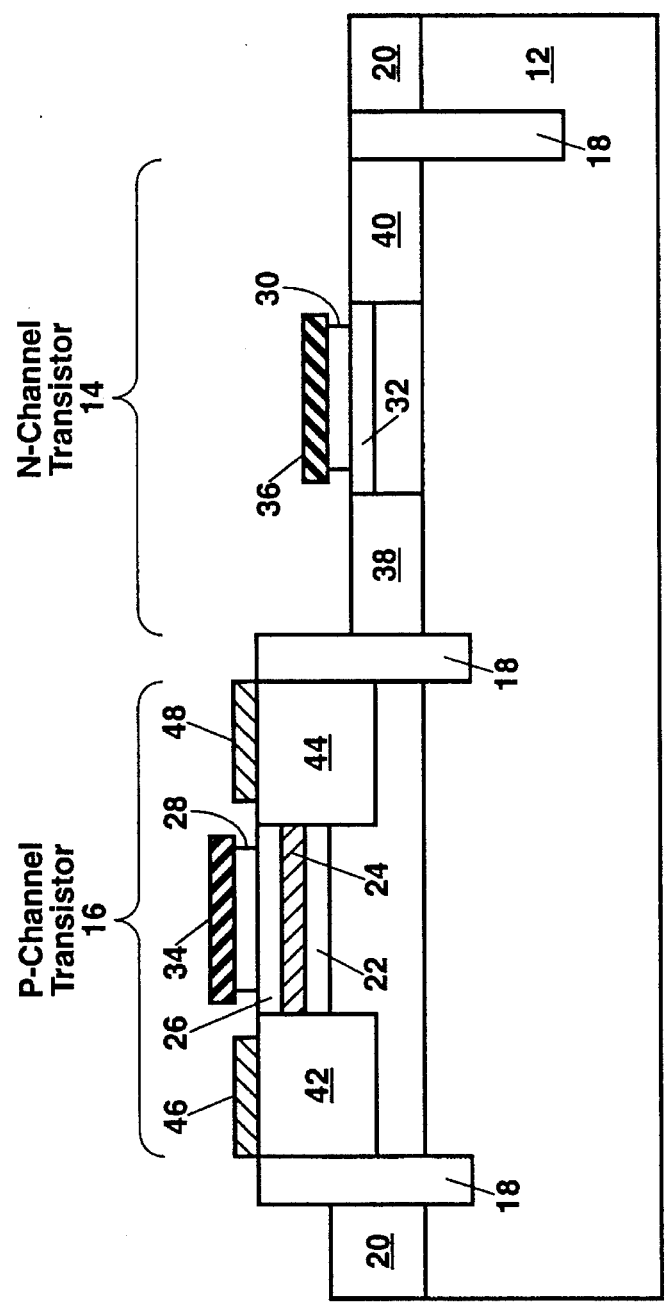

The next step in fabricating the C-JHFET IC 10 is a p-ohmic deposition step to deposit ohmic contacts on the drain and source of the p-channel transistor 16 as shown in FIG. 9. The p-metallization is preferably Be/Au with a thickness of about 300 nm, with patterning by lift-off. After alloying the contact metallization at about 410° C. for about 15 seconds, this step forms the first drain electrode 46 and the first source electrode 48 to the p-channel transistor 16.

Figure 10:
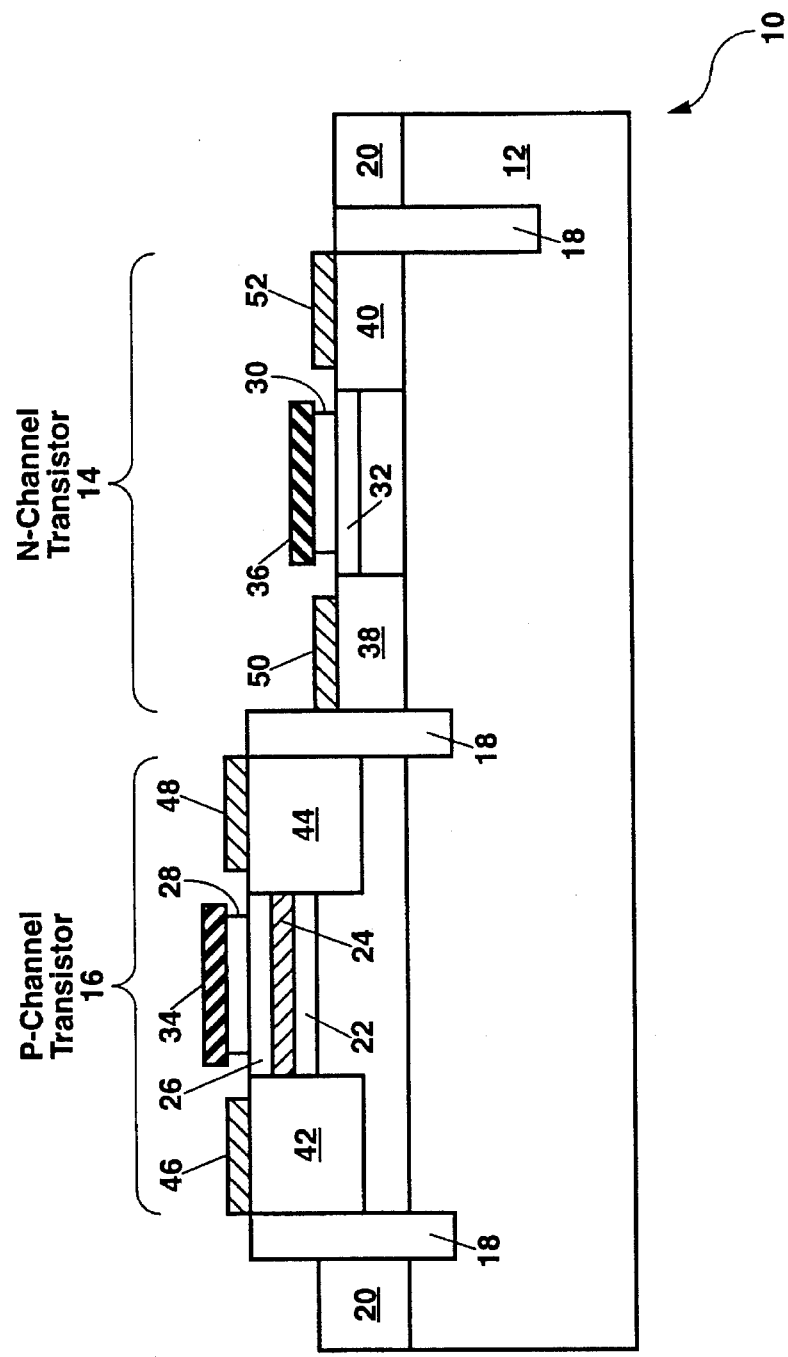

The ohmic contacts to the n-channel transistor are similarly formed in FIG. 10 in an n-ohmic deposition step. This step deposits an n-type contact metallization consisting of, for example, Ge:Au:Ni:Au with layer thicknesses of 26 nm, 54 nm, 15 nm, and 200 nm, respectively. The n-metals am patterned by lift-off, and subsequently alloyed at about 370° C. for about 15 seconds. This step forms the second drain electrode 50 and the second source electrode 52 on the n-channel transistor 14.

Interconnection of the completed n- and p-channel transistors to form logic gates is performed with a two level metallization. Ti/Pt/Au is preferably used as the electrical interconnection metal with silicon nitride used as the insulating material above the transistors and between the metallization levels.

To attain low static power dissipation in the IC 10, it is necessary to minimize both the device off-state currents and the direct-current (dc) leakage currents. To achieve minimal off-state currents, the complimentary JHFET transistors of the present invention are designed with low subthreshold currents; and the device threshold voltage, V$_{th}$ (defined herein as the gate-to-source voltage, V$_{GS}$, at 5 mA/mm of drain current, I$_{DS}$), is designed to be sufficiently large so that the device in the off-state is biased well into the subthreshold regime. To achieve low dc leakage currents, the gate turn-on voltage, V$_{to}$ (defined herein as V$_{GS}$ at 1 mA/mm of gate current), is designed to be higher than the circuit power supply voltage. For compound semiconductors, this may be done by designing the C-JHFETs with a turn-on voltage that is substantially larger than the Schottky barrier height of about 0.5 /volts. In the present invention, junction gates are used to achieve high gate turn-on voltages of about −1.1 volts for the p-channel transistor 16 and about 1.0 volts for the n-channel transistor 14.

In a FET, the thickness of the conducting channel is controlled by the voltage on the gate electrode which fixes the depth of the depletion region under the gate. In operation, a positive voltage on the second gate electrode 36 enhances the second conducting channel 32 turning the n-channel JHFET 14 on. A negative voltage on the first gate electrode 34 enhances the first conducting channel 24 turning the p-channel JHFET 16 on. It should be understood that the threshold voltage of the devices as well as enhancement/depletion mode operation can be chosen by the designer to meet specific circuit needs. (In an n-channel enhancement mode JHFET, $V_{th}>0$, and in an n-channel depletion mode JHFET, $V_{th}<0$.) The threshold voltage, $V_{th}$, of the complimentary JHFETs in the IC 10 may be adjusted in manufacture to obtain symmetrical transistors by controlling the doping profile in the gate channel region by direct ion implantation for the n-channel JHFET 14, or by changing the doping, thickness, or composition of the epitaxial layers 22, 24, and 26 of the p-channel JHFET.

The advantages of a well-designed complimentary IC technology are that there is a minimum of static power consumption; design is easy since it is insensitive to the operating point; there is a great latitude in design and processing because the threshold voltages do not affect the functionality of circuits such as inverters (only the current available); the power supply voltages may be about ±1 volt; and there is good immunity to noise, typically about 20% of the voltage swing (i.e. of the supply voltage).

Figure 11:
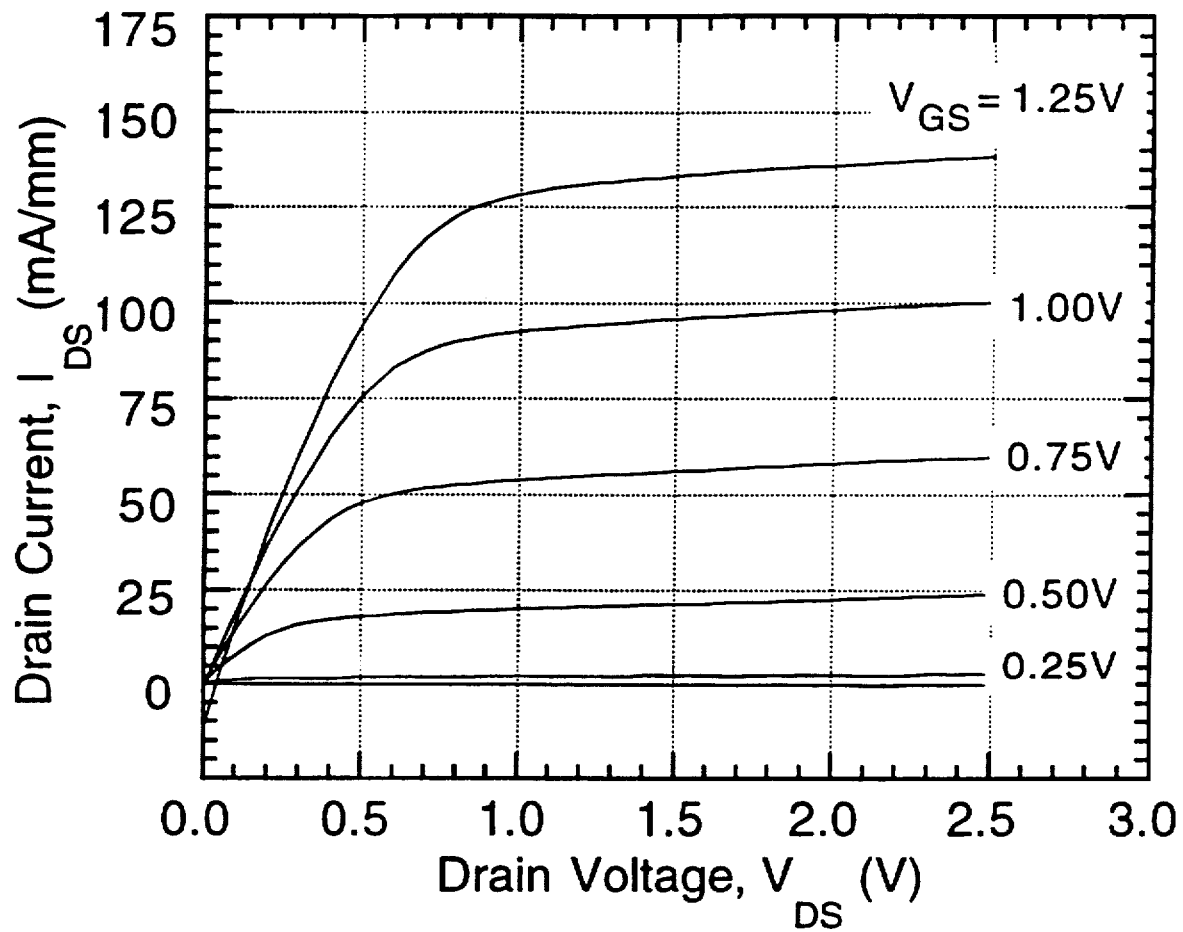
FIG. 11 shows the drain-to-source current-versus-voltage characteristics for a self-aligned 0.8×50 micron gate n-channel junction heterostructure field-effect transistor 16 as a function of the gate-to-drain voltage at 300 K.
Figure 12:
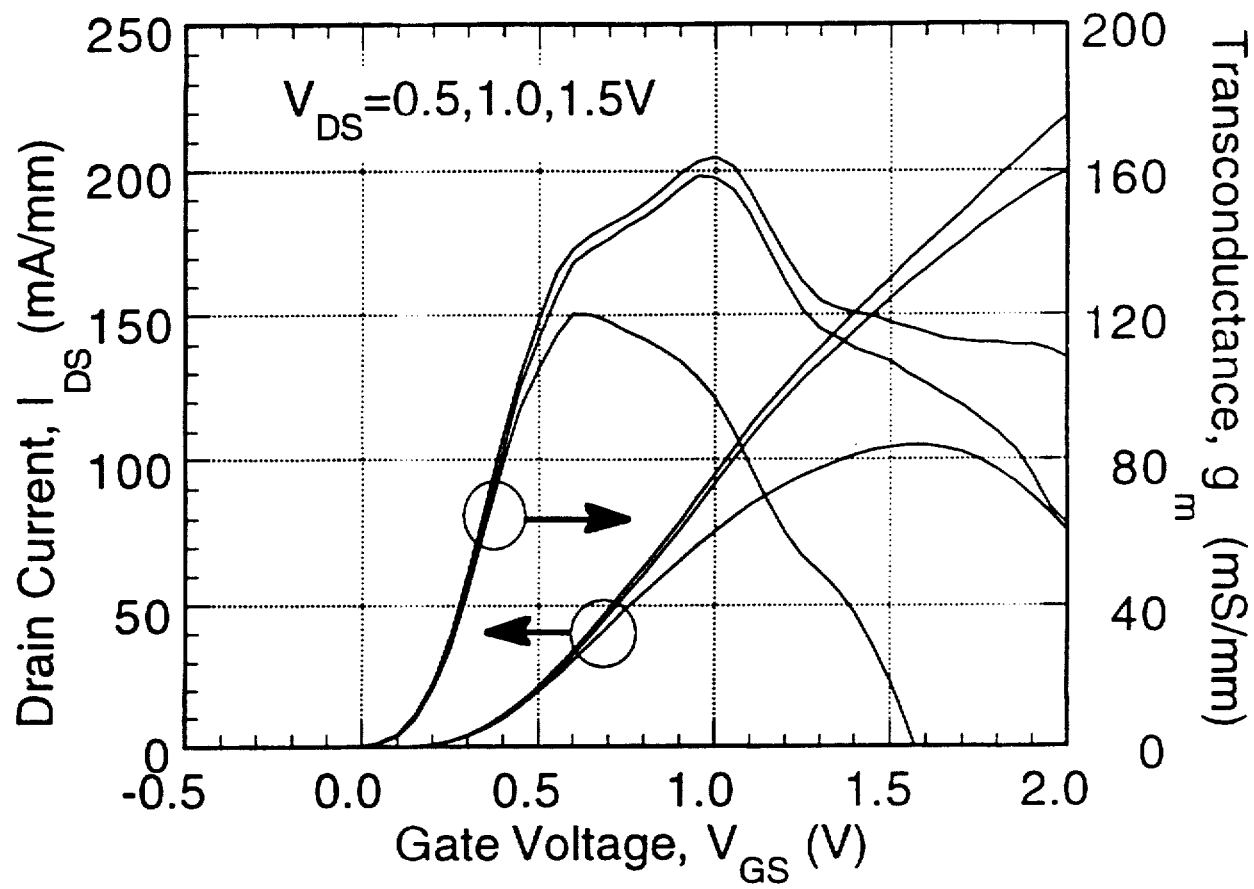
FIG. 12 shows the 300 K. behavior of the drain-to-source current and the transconductance as functions of the gate-to-source voltage for the device of FIG. 11.

FIGS. 11–14 show operating characteristics of complimentary JHFET enhancement-mode transistors in the IC 10 of the present invention. FIG. 11 shows the drain-to-source current-versus-voltage characteristics for a self-aligned 0.8× 50 micron gate n-channel junction heterostructure field-effect transistor 14 as a function of the gate-to-drain voltage at room temperature (300 K.). HG. 12 shows the 300 K. behavior of the n-channel drain-to-source current and the transconductance as functions of the gate-to-source voltage for the device of FIG. 11. In FIG. 11, the threshold voltage, $V_{th}$, of the n-channel transistor 14 is about 0.3 volts, and the maximum transconductance is about 160 mS/mm at $V_{DS}$= 1.0 volt. $V_{to}$ for the n-channel transistor is 1.0 volts. At a power supply voltage of 1.0 volt, the n-channel transistor device-on/leakage current ratios (i.e. the ratios of the on- to off-current flow and the on-current to the gate current in the transistor) are greater than or equal to 90.

Figure 13:
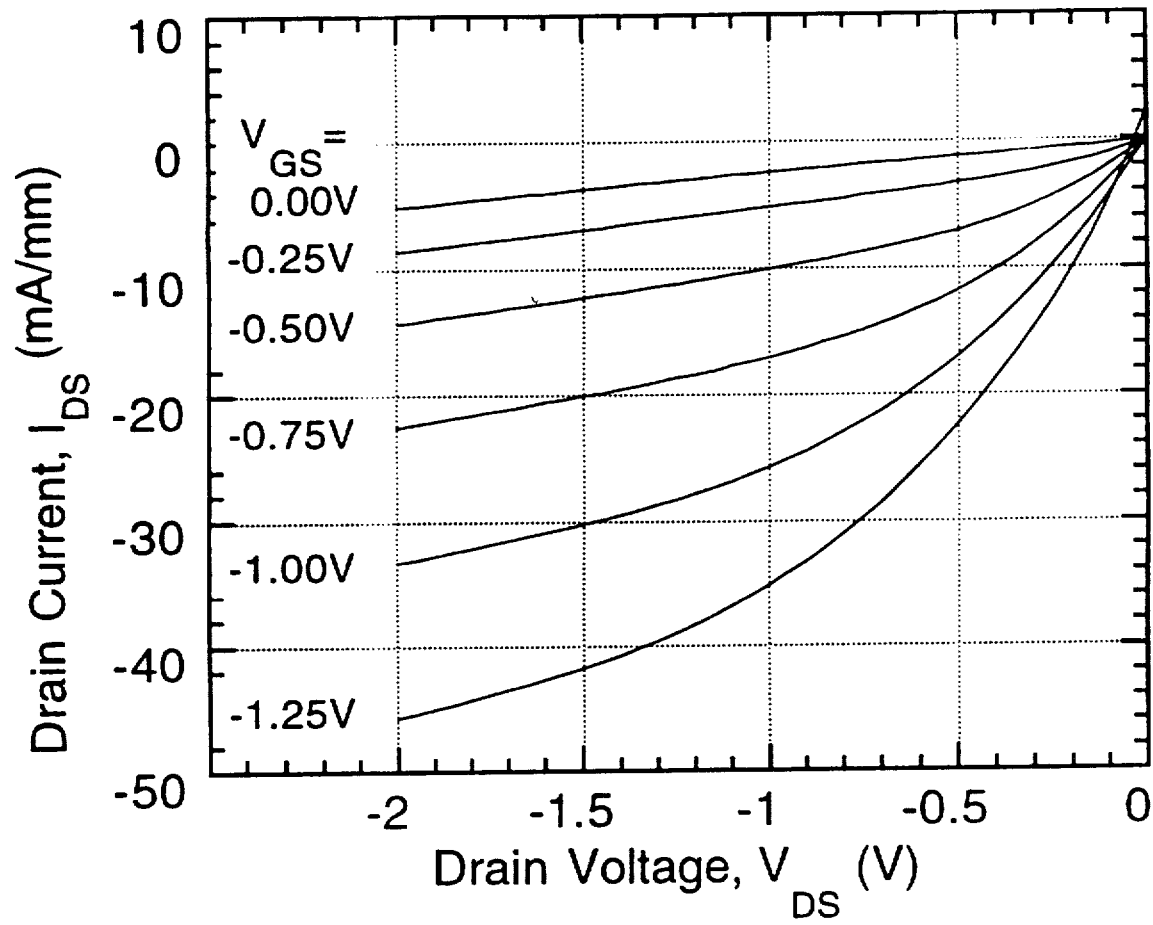
FIG. 13 shows the drain-to-source current-versus-voltage characteristics for a self-aligned 1.0×50 micron gate p-channel junction heterostructure field-effect transistor 16 as a function of the gate-to-drain voltage at 300 K.

FIG. 13 shows the drain-to-source current-versus-voltage characteristics for a self-aligned 1.0×50 micron gate p-channel junction heterostructure field-effect transistor 16 as a function of the gate-to-drain voltage at 300 K.

Figure 14:
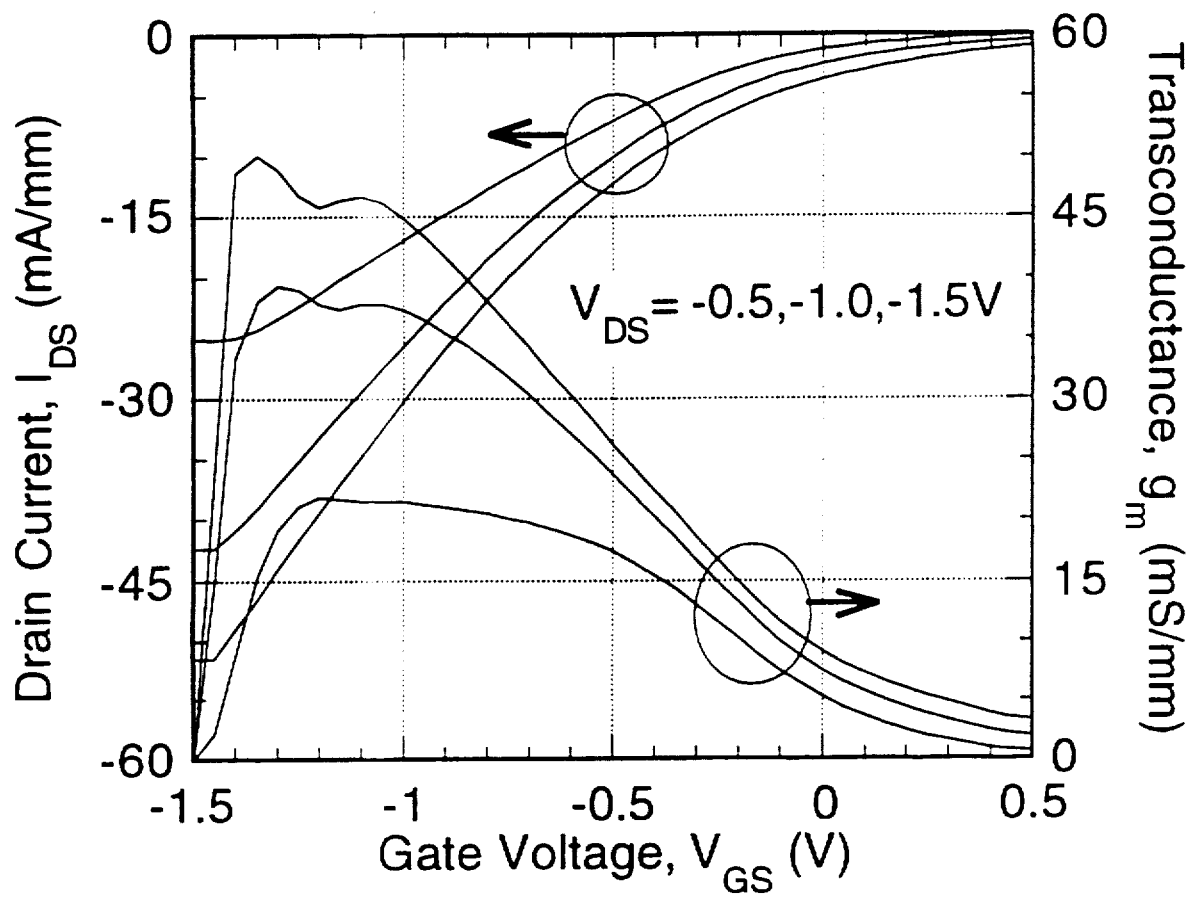
FIG. 14 shows the 300 K. behavior of the drain-to-source current and the transductance as, functions of the gate-to-source voltage for the device of FIG. 13.

Because of the $V_{to}$ values, the IC 10 is preferably operated at a power supply voltages of about ±1.0 volt to about ±1.25 volts. FIG. 14 shows the 300 K. behavior of the p-channel drain-to-source current and the transconductance as functions of the gate-to-source voltage for the device of FIG. 13. In FIG. 14, the magnitude of the threshold voltage, $V_{th}$, of the p-channel transistor 16 is very comparable to that of the n-channel device, being about −0.3 volts. The maximum transconductance of the p-channel transistor in FIG. 14 is about 40 mS/mm at $V_{DS}$=1.0 volts and increases to about 50 mS/mm at $V_{DS}$=1.5 vol. The value of $V_{to}$ for this p-channel transistor is 1.1 volts.

P-channel transistors fabricated according to the present invention can hold 1.15 volts on the gate with a gate leakage current of 1 microampere/micron; and n-channel JHFETs can hold 0.95 volts on the gate at the same gate leakage current. The gate leakage represents the largest dc power dissipation for the complimentary IC 10.

The important parameters of FET characteristics for digital ICs are the transconductance and the maximum frequency of operation. To minimize the total propagation delay in an IC, the supply voltages should be reduced to the a minimum value, which ultimately depends on the noise margins and basic delays. High-speed operation at low supply voltages requires a high mobility in the channel to maintain a constant drift velocity.

The self-aligned refractory gate process of the present invention avoids the excess gate capacitance associated with conventional JFETs. The junction gates 28 and 30 are made coincident with or slightly undercut from the refractory metal gate electrodes 34 and 36 in contrast to conventional JFETs which have both metal overhang capacitance and extension of the gate region beyond the edge of the gate metal electrode. The self-aligned n-channel JHFET 14 of the present invention shows no rf speed penalty over prior art MESFETs, but has the advantage of a higher gate turn-on voltage.

Figure 15:
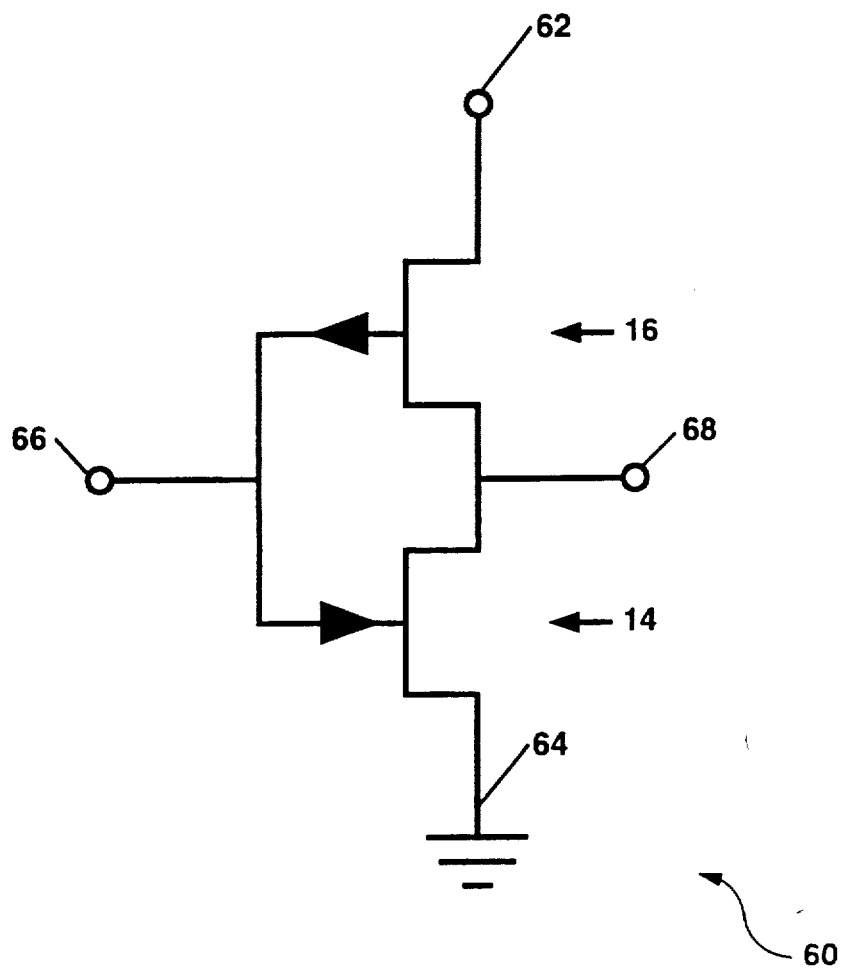
FIG. 15 shows an embodiment of the present invention in which an inverter circuit 60 is formed from the complimentary n- and p-channel junction heterostructure field-effect transistors.

FIG. 15 shows a dc inverter circuit 60 which is a specialized type of IC 10 that may be formed from the complimentary n- and p-channel junction heterostructure field-effect transistors of the present invention. The inverter circuit 60 comprises a p-channel JHFET 16 and an n-channel JHFET 14 that are directly connected together as shown in FIG. 15. A power supply connection 62 and a ground connection 64 are made to the transistor pair. The inverter input 66 is common to the two gate electrodes 34 and 36 that are connected together, and the inverter output 68 is taken from the common drain/source interconnection of the two JHFETs. An advantage of the use of the complementary technology of the present invention is that the inverter circuit 60 is simple, having only two direct-coupled transistors; and no level translation is required.

Figure 16:
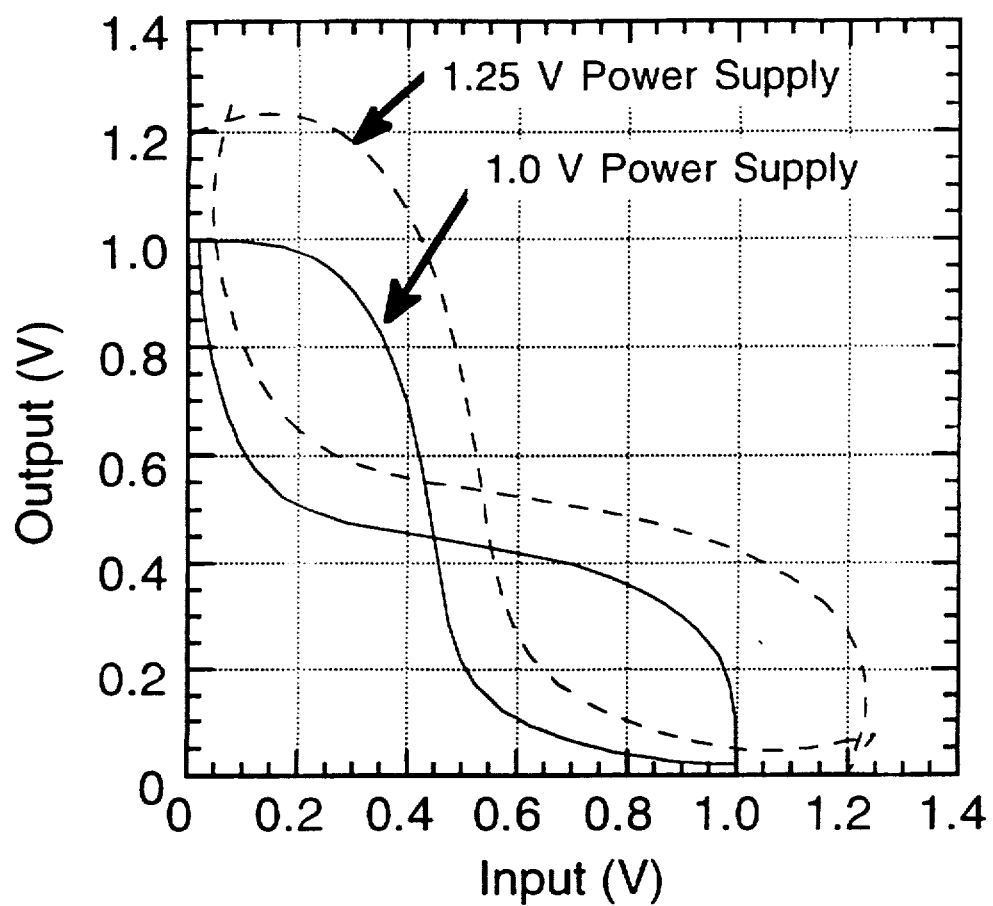
FIG. 16 shows the voltage transfer curves of the inverter circuit of FIG. 15.

FIG. 16 shows the operation of the inverter circuit 60 at power supply voltages of 1.0 and 1.25 volts. Noise margins of greater than 200 mV are obtained for the inverter with a power supply voltage of 1.0 volts.

Figure 17:
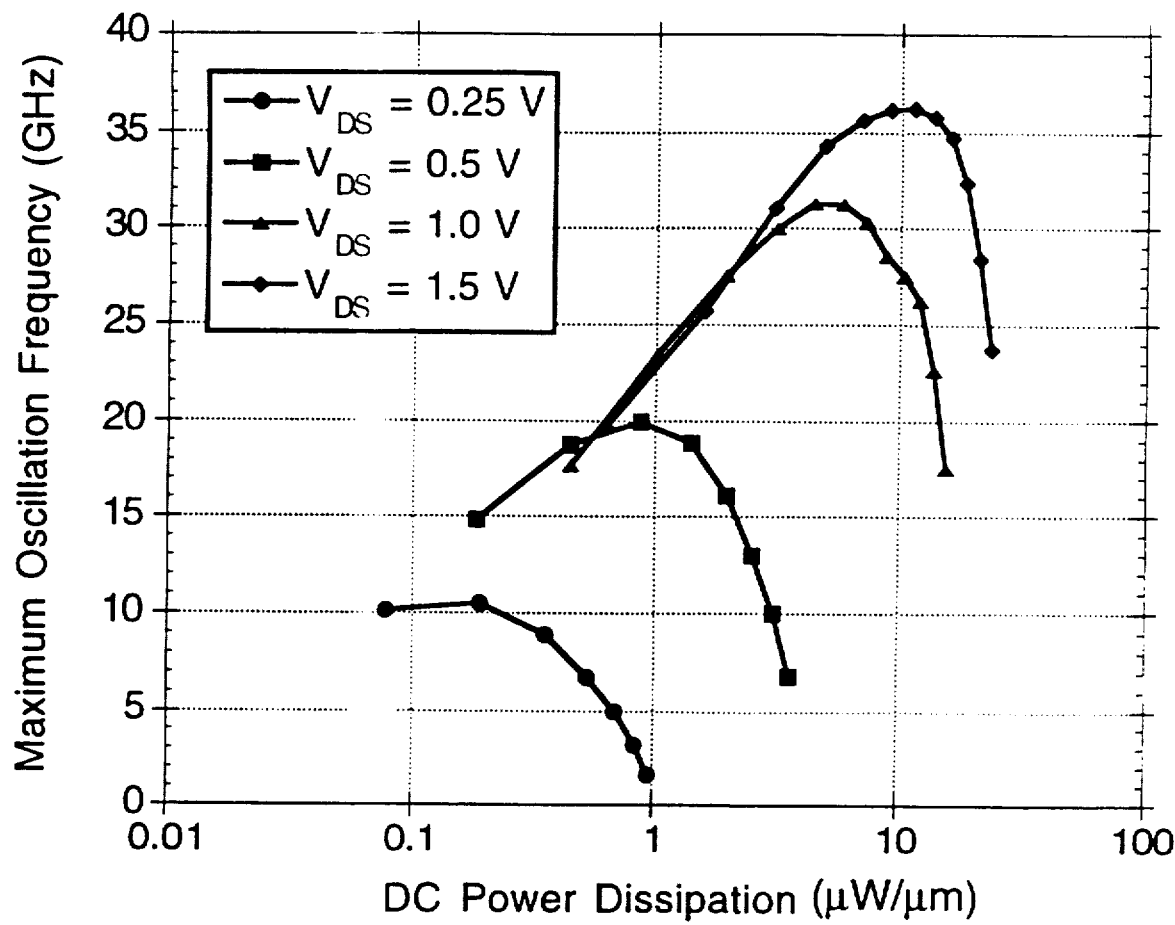
FIG. 17 shows frequency response curves illustrating the maximum frequency of oscillation as a function of power dissipation for a 0.9×100 micron gate n-channel junction heterostructure field-effect transistor 14 according to the present invention.

FIG. 17 shows frequency response curves illustrating the maximum frequency of oscillation for a 0.9×100 micron gate n-channel junction heterostructure field-effect transistor 14 as a function of the dissipated dc power. With a dc power dissipation of only 10 microWatts/micron, this JHFET operates at a maximum frequency of 20 GHz. With a dc power dissipation of 100 microWatts/micron, the maximum frequency of oscillation may be increased to over 35 GHz.

31-stage ring oscillators loaded with a 200 micron interconnection wire between each stage may also be fabricated according to the present invention. These ring oscillators show gate delays as low as 179 picoseconds for a power supply voltage of 1.2 volts, and have a power-delay product of about 28 femtoJoules. Power-delay products as low as 8.9 femtoJoules am obtained at a speed of 320 picoseconds/ stage and a power supply voltage of 0.8 volts.

The complimentary n- and p-channel JHFETs according to the present invention are basic building blocks that may be interconnected to provide any digital logic function using fewer devices and simpler circuitry than is possible with devices of a single FET type.

While the present invention has been described in terms of embodiments utilizing gallium arsenide, aluminum gallium arsenide, and indium gallium arsenide, it will be apparent to those skilled in the art that other compound semiconductor materials may be utilized.

What is claimed is:

1. An integrated circuit comprising:
   (a) a compound semiconductor substrate having a plurality of epitaxially grown layers formed thereon, the layers including a buffer layer on the substrate, at least one first conducting channel layer above the buffer layer, a high bandgap layer above the first conducting channel layer and having a bandgap higher than the bandgap of the first conducting channel layer, and a first gate layer above the higher-bandgap layer;
   (b) at least one p-channel junction heterostructure field-effect transistor formed in the epitaxial layers, the p-channel transistor further comprising a first drain, a first source, and a first gate, and a plurality of electrodes thereupon;
   (c) at least one n-channel junction heterostructure field-effect transistor formed in the buffer layer, the n-channel transistor being located proximate to the p-channel transistor and in a region wherein the epitaxial layers above the buffer layer are removed, the n-channel transistor further comprising a second drain, a second source, and a second gate, and a plurality of electrodes thereupon; and
   (d) at least one isolation region formed in the substrate between the p-channel and n-channel transistors.

2. The integrated circuit in claim 1 in which the substrate is gallium arsenide.

3. The integrated circuit in claim 1 in which the at least one first conducting channel layer is a strained quantum-well layer.

4. The integrated circuit in claim 3 in which the strained quantum-well layer is an indium gallium arsenide layer.

5. The integrated circuit in claim 1 in which the buffer layer includes a leakage barrier.

6. The integrated circuit in claim 5 in which the leakage barrier is a semiconductor p-n junction.

7. The integrated circuit in claim 5 in which the leakage barrier forms the second gate and a second conducting channel of the n-channel transistor.

8. The integrated circuit in claim 5 in which the leakage barrier is modulation doping layer.

9. The integrated circuit in claim 5 in which the leakage barrier is formed from a semiconductor material having a bandgap higher than the bandgap of the first conducting channel.

10. The integrated circuit in claim 1 in which the high bandgap layer includes modulation doping means.

11. The integrated circuit in claim 1 in which the high bandgap layer includes a strain compensation region.

12. The integrated circuit in claim 1 in the form of a plurality of interconnected p-channel transistors and n-channel transistors.

* * * * *

UNITED STATES PATENT AND TRADEMARK OFFICE
CERTIFICATE OF CORRECTION

PATENT NO.   : 5,479,033
DATED        : December 26, 1995
INVENTOR(S)  : Baca et al.

It is certified that error appears in the above-identified patent and that said Letters Patent is hereby corrected as shown below:

Add drawing sheets, consisting of figs. 11-17, as shown on the attached pages.

Signed and Sealed this

Twenty-third Day of April, 1996

Attest:

BRUCE LEHMAN

Attesting Officer

Commissioner of Patents and Trademarks